United States Patent
Kiuchi et al.

(10) Patent No.: US 8,623,516 B2
(45) Date of Patent: Jan. 7, 2014

(54) CURABLE RESIN COMPOSITION, AND MOLDED ARTICLE, PREPREG AND LAMINATE USING THE SAME

(75) Inventors: Takashi Kiuchi, Tokyo (JP); Kiyoshige Kojima, Tokyo (JP)

(73) Assignee: Zeon Corporation, Tokyo (JP)

( * ) Notice: Subject to any disclaimer, the term of this patent is extended or adjusted under 35 U.S.C. 154(b) by 446 days.

(21) Appl. No.: 12/919,999

(22) PCT Filed: Mar. 2, 2009

(86) PCT No.: PCT/JP2009/053905
§ 371 (c)(1),
(2), (4) Date: Aug. 27, 2010

(87) PCT Pub. No.: WO2009/107844
PCT Pub. Date: Sep. 3, 2009

(65) Prior Publication Data
US 2011/0008636 A1  Jan. 13, 2011

(30) Foreign Application Priority Data
Feb. 29, 2008  (JP) .................. 2008-051082

(51) Int. Cl.
*B23B 27/08* (2006.01)
*B05D 3/02* (2006.01)
*C08F 2/08* (2006.01)

(52) U.S. Cl.
USPC .................... 428/516; 524/396; 427/385.5

(58) Field of Classification Search
None
See application file for complete search history.

(56) References Cited

U.S. PATENT DOCUMENTS 5,728,785 A * 3/1998 Grubbs et al. ............. 526/142
6,346,581 B1 * 2/2002 Tsunogae et al. ......... 525/332.1

FOREIGN PATENT DOCUMENTS

| | | |
|---|---|---|
| JP | 6-248164 A | 9/1994 |
| JP | 11-507962 A | 7/1999 |
| JP | 2003-213049 A | 7/2003 |
| JP | 2004-244609 A | 9/2004 |
| JP | 2005-47992 A | 2/2005 |
| JP | 2005-232342 A | 9/2005 |
| JP | 2008-143956 A | 6/2008 |
| JP | 2008-150569 A | 7/2008 |
| WO | WO 2004/003052 A1 | 1/2004 |
| WO | WO2004/069895 A | 8/2004 |

OTHER PUBLICATIONS

International Search Report dated Apr. 28, 2009 in International Application No. PCT/JP2009/053905.

* cited by examiner

*Primary Examiner* — Sheeba Ahmed
(74) *Attorney, Agent, or Firm* — Birch, Stewart, Kolasch & Birch, LLP

(57) ABSTRACT

There is provided a curable resin composition comprising a cycloolefin polymer and a cyclic peroxide which has a cyclic structure and a peroxy structure in the cyclic structure. There is also provided a laminate obtained by using a molded article which is obtained by forming the curable resin composition into a sheet shape or a prepreg which is obtained by impregnating the curable resin composition into a reinforcing fiber.

17 Claims, No Drawings

CURABLE RESIN COMPOSITION, AND MOLDED ARTICLE, PREPREG AND LAMINATE USING THE SAME

TECHNICAL FIELD

The present invention relates to a curable resin composition, and a molded article, a prepreg and a laminate using the same, and more specifically, relates to a sheet shaped molded article and prepreg which provide a laminate having significantly low dielectric loss at high frequency bands and production methods thereof.

BACKGROUND ART

In recent years, Owing to the emergence of the advanced information age, information transmission has been in trends of high speed and high frequency, and microwave communication and millimeter-wave communication have been in reality. For circuit boards in such high frequency age, materials with low dielectric tangents are required in order for transmission losses at high frequency to be minimally reduced, and cycloolefin polymer attracts attention as such material.

For example, Patent Document 1 discloses a technique for obtaining a multilayer board through: applying polymerizable composition which contains norbornene based monomer, metathesis ring-opening polymerization catalyst and peroxide such as di-t-butylperoxide onto a rough surface of an electrolytic copper foil; covering the surface with a glass-fiber reinforced PTFE resin film; making the copper foil side adhere to an aluminum plate heated to 145° C. for one minute and polymerizing the above composition; thereafter peeling away the glass-fiber reinforced PTFE resin film thereby obtaining a copper foil with resin; then clipping a both-sided copper-clad laminate board of CZ-treated glass epoxy with the copper foils with resin such that the resin sides are located inside thereof; and heat pressing them during 15 minutes at 200° C. under the press pressure of 5.2 MPa.

In addition, Patent Document 2 discloses that a laminated board was obtained through: coating mixture liquid obtained by mixing 2-norbornene, metathesis polymerization catalyst, 1,3-di(2-t-butylperoxyisopropyl) benzene (one-minute half-life temperature being 175° C.), etc. onto a supporting film of continuous polyethylene naphthalate film, heating them in a heating furnace at 150° C. during 30 seconds thereby polymerizing, rewinding the obtained film on the support film by using a film rewinding section with the support film; thereafter clipping a both-sided copper-clad laminate board of CZ-treated glass epoxy with the above film; and heat pressing them during 15 minutes at 200° C. under the press pressure of 5.2 MPa.

Patent Document 3 discloses that a laminated board was obtained through: impregnating polymerizable composition which contains norbornene based monomer, metathesis ring-opening polymerization catalyst and peroxide such as di-t-butylperoxide into glass cloths and then polymerizing thereby produsing prepregs; next laminating three layers of obtained prepregs and clipping them from both sides with copper foils; and heat pressing them thereby hardening. However, it is desired to further reduce dielectric tangents at high frequency bands in such laminates disclosed in these documents.

[Patent Document 1] International Publication No. WO2004/003052
[Patent Document 2] International Publication No. WO2004/069895
[Patent Document 3] International Publication No. WO2004/003052

DISCLOSURE OF THE INVENTION

Problem to be Solved by the Invention

The object of the present invention is to provide a molded article and a prepreg which provide a laminate superior in laminatability and low in dielectric loss at high frequency bands and production method thereof, and a laminate configured by using the molded article and the prepreg.

Means for Solving the Problems

As a result of intensive studies to solve the above problems, the present inventors have found out that a molded article and a prepreg obtained by using a curable resin composition containing cycloolefin polymer and cyclic peroxide which has a cyclic structure and a peroxy structure [R—O—O—R' (in formula, each of R and R' being hydrocarbon group)] in the cyclic structure provide sufficiently small dielectric tangent at high frequency bands and are superior in laminatability with other material such as circuit board. In addition, the present inventors have also found out that the laminatability and the decreasing of the dielectric loss are significantly highly balanced in the obtained laminate by using cyclic peroxide having one-minute half-life temperature within a certain range. Based on such findings, the present inventors completed the present invention.

Thus, according to the present invention, there are provided the following [1] to [9].

[1] A curable resin composition comprising a cycloolefin polymer and a cyclic peroxide which has a cyclic structure and a peroxy structure in the cyclic structure.

[2] The curable resin composition as set forth in [1], wherein one-minute half-life temperature of the cyclic peroxide is within a range of 150° C. to 250° C.

[3] The curable resin composition as set forth in [1] or [2], further comprising a curing aid.

[4] A molded article obtained by forming the curable resin composition as set forth in any one of [1] to [3] into a sheet shape.

[5] A production method of the molded article as set forth in [4], comprising applying onto a support medium, a polymerizable composition comprising a cycloolefin monomer, a polymerization catalyst, and a cyclic peroxide which has a cyclic structure and a peroxy structure in said cyclic structure and thereafter polymerizing the same.

[6] A laminate obtained by laminating the molded article as set forth in [4] with other material A and thereafter curing the same.

[7] A prepreg obtained by impregnating the curable resin composition as set forth in any one of [1] to [3] into a reinforcing fiber.

[8] A production method of the prepreg as set forth in [7], comprising impregnating, into a reinforcing fiber, a polymerizable composition comprising a cycloolefin monomer, a polymerization catalyst, and a cyclic peroxide which has a cyclic structure and a peroxy structure in the cyclic structure and thereafter polymerizing the same.

[9] A laminate obtained by laminating two or more of the prepregs as set forth in [7] with one another or laminating the prepreg as set forth in [7] with other material B and thereafter curing the same.

EFFECTS OF THE INVENTION

According to the present invention, it is easy to provide a molded article and a prepreg which provide a laminate superior in laminatability and low in dielectric loss at high frequency bands. Moreover, because the laminate of the present invention shows low dielectric loss at high frequency bands, it may be preferably used for a high frequency circuit board for usage of telecommunication equipment or the like at high frequencies of microwave and millimeter-wave etc.

BEST MODE FOR CARRYING OUT THE INVENTION

The curable resin composition of the present invention is configured to contain cycloolefin polymer and cyclic peroxide which has a cyclic structure and a peroxy structure in the cyclic structure.
(Cycloolefin Polymer)
Cycloolefin polymer used in the present invention is a polymer containing at least cycloolefin monomer unit and usually is a thermoplastic resin obtained by polymerizing cycloolefin monomer. As the polymer, a polymer of cycloolefin monomer known in the art is available without specific limitation. In the case that cycloolefin polymer has a cyclic structure in cycloolefin monomer unit, as such cyclic structure, saturated cyclic hydrocarbon (cycloalkane) structure, and unsaturated cyclic hydrocarbon (cycloalkene) structure etc. may be mentioned. Although the number of carbon atoms forming the cyclic structure is not particularly limited, it is usually in a range of 4 to 30, preferably 5 to 20, and more preferably 5 to 15. While the ratio of cycloolefin monomer units in the cycloolefin polymer may be suitably selected, it is preferably 50 wt % or more, more preferably 70 wt % or more, and furthermore preferably 90 wt % or more. It is preferred that the ratio of cycloolefin monomer units is within such ranges because the mechanical strength of the laminate to be obtained will be improved. Specifically as cycloolefin polymer, ring-opening polymer of cycloolefin monomer, addition polymer of cycloolefin monomer, addition copolymer of cycloolefin monomer and linear olefin monomer, and hydrogenation product thereof may be mentioned.

The cycloolefin monomer is a compound having a cyclic structure formed with carbon atoms and carbon-carbon double bond in the cyclic structure. As examples thereof, norbornene based monomer, and monocyclic cycloolefin monomer etc. may be mentioned, and normornene based monomer is preferable. The norbornene based monomer is a monomer including norbornene ring. While not particularly limited as the norbornene monomer, for example, 2-norbornene, norbornadiene and other bicyclic compounds; dicyclopentadiene, dihydrodicyclopentadiene and other tricyclic compounds; tetracyclododecene, ethylidenetetracyclododecene, phenyltetracyclododecene and other tetracyclic compounds; tricyclopentadiene and other pentacyclic compounds; tetracyclopentadiene and other heptacyclic compounds; alkyl substitution compounds (methyl, ethyl, propyl and butyl substitution compounds etc.), alkylidene substitution compounds (for example, ethylidene substitution compound) and aryl substitution compounds (for example, phenyl and tolyl substitution compounds) thereof; and derivatives thereof having epoxy group, methacryl group, hydroxyl group, amino group, carboxyl group, cyano group, halogen atom, ether bond (—O—) containing group, ester bond [—C (=O) O—] containing group and other polar groups; etc. may be mentioned.

As the monocyclic cycloolefin monomer, for example, cyclobutene, cyclopentene, cyclooctene, cyclododecene, 1,5-cyclooctadiene and other monocyclic cycloolefins, and substitution compounds and derivatives having polar groups like those mentioned as examples for the norbornene based monomer may be mentioned. Such cycloolefin monomers may be used alone or in combinations of two or more types.

While the above linear olefin monomer is not particularly limited insofar as being addition-copolymerizable with the above cycloolefin monomer, for example, ethylene, propylene, 1-butene, 1-pentene, 1-hexene, 1-octene, 1-butene, 2-pentene, and 1,4-hexadiene etc. may be mentioned. Amount of the linear olefin monomer to be used is usually 50 wt % or less, preferably 20 wt % or less, and more preferably 10 wt % or less to the total amount of the cycloolefin monomer and the linear olefin monomer.

While the molecular weight of the cycloolefin polymer may be suitably selected in accordance with the purpose of use, it is usually in a range of 1,000 to 1,000,000, preferably 5,000 to 500,000, and more preferably 10,000 to 100,000 as weight-average molecular weight corresponding to polystyrene to be measured by gel permeation chromatography (eluant; tetrahydrofuran).
(Curing Agent)
The curable resin composition and the polymerizable composition of the present invention contains, as a curing agent, cyclic peroxide which has a cyclic structure and a peroxy structure in the cyclic structure. The curing agent is a compound capable of inducing a curing (cross-linking) reaction in the molded article to be obtained etc. By using such cyclic peroxide, the molded article and the prepreg to be obtained can be superior in laminatability and the laminate to be obtained can be small in dielectric loss at high frequency bands.

As such cyclic peroxide, for example, 3,3,5,7,7-pentamethyl-1,2,4-trioxepane (one-minute half-life temperature being 205° C.), 3,6,9-triethyl-3,6,9-trimethyl-1,4,7-triperoxonan (one-minute half-life temperature being 190° C.), and 3,6-diethyl-3,6-dimethyl-1,2,4,5-tetroxane (one-minute half-life temperature being 167° C.) etc. may be mentioned to be preferable examples.

While the one-minute half-life temperature of cyclic peroxide to be used in the present invention may be suitably selected in accordance with the type of cyclic peroxide and the use condition, it is usually in a range of 50° C. to 350° C., preferably 150° C. to 250° C., and more preferably 180° C. to 230° C. One-minute half-life temperature herein is the temperature where the half of cyclic peroxide decomposes during one minute. It is preferred that one-minute half-life temperature is within such ranges because the laminatability and the decreasing of the dielectric loss are significantly highly balanced in the laminate to be obtained.

Such cyclic peroxide may be used alone or in combinations of two or more types, and the amount to be used is usually in a range of 0.01 to 10 parts by weight, preferably 0.1 to 10 parts by weight, and more preferably 0.5 to 5 parts by weight with respect to the cycloolefin polymer as 100 parts by weight.
(Curable Resin Composition)
The curable resin composition of the present invention contains the above cycloolefin polymer and cyclic peroxide as essential components, and in accordance with need, filler, anti-aging agent, curing aid and other compounding agents etc. may be added thereto.

In the present invention, it is preferred to blend the filler into curable resin composition because the heat tolerance of the laminate to be obtained can be highly improved. As the filler, both inorganic filler and organic filler may be used without particular limitation insofar as generally used industrially. The inorganic filler is preferable.

As the inorganic filler, for example, iron, copper, nickel, gold, silver, aluminum, lead, tungsten and other metal particles; carbon black, graphite, activated carbon, carbon balloon and other carbon particles; silica, silica balloon, alumina, titanium oxide, iron oxide, zinc oxide, magnesium oxide, tin oxide, beryllium oxide, barium ferrite, strontium ferrite and other inorganic oxide particles; calcium carbonate, magnesium carbonate, sodium hydrogen carbonate and other inorganic carbonate particles; calcium sulfate and other inorganic sulfate particles; talc, clay, mica, kaolin, fly ash, montmorillonite, calcium silicate, glass, glass balloon and other inorganic silicate particles; calcium titanate, lead zirconate titanate and other titanate particles, aluminum nitride and silicon carbide particles and whiskers etc. may be mentioned.

As the organic filler, for example, wood powder, starch, organic pigment, polystyrene, nylon, polyolefins such as polyethylene and polypropylene, vinyl chloride, various types of elastomers, waste plastic and other compound particles may be mentioned.

Such filler may be used alone or in combinations of two or more types, and the blending amount thereof is usually in a range of 1 to 1,000 parts by weight, preferably 10 to 500 parts by weight, and more preferably 50 to 350 parts by weight with respect to the cycloolefin polymer as 100 parts by weight.

In the present invention, it is preferred to add to the curable resin composition at least one kind of anti-aging agent selected from the group consisting of phenol based anti-aging agent, amine based anti-aging agent, phosphorus based anti-aging agent and sulfur based anti-aging agent because the heat tolerance of the laminate to be obtained is significantly improved without inhibiting the curing reaction. Among them, phenol based anti-aging agent and amine based anti-aging agent are preferable, and phenol based anti-aging agent is particularly preferable.

Such anti-aging agents may be used alone or in combinations of two or more types. While the amount of the anti-aging agent to be used is suitably selected in accordance with the purpose of use, it is usually in a range of 0.0001 to 10 parts by weight, preferably 0.001 to 5 parts by weight, and more preferably 0.01 to 1 part by weight with respect to the cycloolefin polymer as 100 parts by weight.

In the present invention, it is preferred to add the curing aid to the curable resin composition because the laminatability of the molded article and prepreg to be obtained and the mechanical strength and the crack resistance of the laminate to be obtained are significantly improved. The curing aid is two or more functional compound which is able to form a cross-linked structure. While the curing aid to be used in general are available without particular limitation, for example, bifunctional compound having two carbon-carbon unsaturated bonds, and multifunctional compound having three or more carbon-carbon unsaturated bonds etc. may be mentioned.

As the specific examples of the curing aid, p-diisopropenyl benzene, m-diisopropenyl benzene, o-diisopropenyl benzene, ethyleneglycoldi (meth)acrylate, propanedioldi (meth)acrylate, butanedioldi (meth)acrylate, diethyleneglycoldi (meth)acrylate, triethyleneglycoldi (meth)acrylate, tetraethyleneglycoldi (meth)acrylate, polyethyleneglycoldi (meth)acrylate and other bifunctional compounds, triisopropenyl benzene, trimethaallylisocyanate, trimethylolpropanetri (meth)acrylate, trimethylolethane (tri) methacrylate, trimethylolpropanepropyleneoxide modified tri (meth)acrylate and other trifunctional compounds etc. may be mentioned. Among them, from the view point of achieving low dielectric loss of the laminate to be obtained and improving the mechanical strength of the laminate, di (meth)acrylates and tri (meth)acrylates which are composed of carbon hydride as main framework are preferable, dimethacrylates and trimethacrylates are more preferable, trimethacrylates is furthermore preferable. Note that (meth)acrylate means methacrylate or acrylate in the specification.

Such curing aid may be used alone or in combinations of two or more types. While the amount of the curing aid to be used is suitably selected in accordance with the purpose of use, it is usually 0.1 to 50 parts by weight, preferably 0.5 to 30 parts by weight, more preferably 1 to 20 parts by weight, and most preferably 5 to 15 parts by weight with respect to the cycloolefin polymer as 100 parts by weight.

As the other compounding agents, flame retardant, coloring agent, light stabilizer, pigment and foaming agent etc. may be mentioned. As the flame retardant, phosphorus-containing flame retardant, nitrogen-containing flame retardant, halogen-containing flame retardant, aluminum hydroxide and other metal hydroxides, and antimony trioxide and other antimony compounds etc. may be mentioned. As the coloring agent, dye compound and pigment etc. may be used. Because there are various types of dye compounds, known in the art may be suitably selected and used. While these other compounding agents may be used alone or in combinations of two or more types, the amount thereof to be used is suitably selected within the extent not to reduce the effect of the present invention.

(Molded Article)

The molded article of the present invention is configured by forming the above curable resin composition of the present invention into sheet-like shape. While the method of forming is not particularly limited and any known forming methods in the art may be adopted, for example, the method of dissolving or dispersing the curable resin composition into solvent, applying them onto a support medium, and then drying the solvent may be mentioned. While the solvent is not limited insofar as being capable of dissolving or dispersing the curable resin composition, xylene, toluene, hexane, cyclohexane, octane and terpene etc. may be mentioned.

As the support medium to be used in the present invention, for example, metal foil, resin support film, metal drum, steel belt and fluorine resin belt etc. may be mentioned. Among them, it is preferred to use metal foil or resin support film in the present invention.

As the specific examples of metal foil, copper foil, aluminum foil, nickel foil, chrome foil, gold foil and silver foil etc. may be mentioned, and copper foil is particularly preferable. While the copper foil to be used is not particularly restricted insofar as being used for normal copper-clad laminate, the thickness and the roughness status thereof may be suitably selected in accordance with the purpose of use.

In addition, the surface of metal foil may be treated with silane coupling agent, thiol based coupling agent, titanate based coupling agent, various types of adhesives etc, and the one which is treated with silane coupling agent is particularly preferable. As specific examples of the silane coupling agent, allyltrimethoxysilane, styryltrimethoxysilane, N-β-(N-(vinylbenzyl)aminoethyle)-γ-aminopropyltrimethoxysilane and salt thereof, vinyltris(2-methoxyethoxy) silane, σ-methacryloxybutyltrimethoxysilane, γ-mercaptopropyltrimethoxysilane, and N-β-(aminoethyl)-γ-aminopropyltrimethoxysilane etc. may be mentioned.

As the specific examples of resin support film, polyethylene terephthalate film, polypropylene film, polyethylene film, polycarbonate film, polyethylene naphthalate film, polyarylate film, nylon film, and polytetrafluoroethylene film etc. may be mentioned.

While the thickness of such support medium is not particularly limited, from the view point of workability, it is usually in a range of 1 to 150 μm, preferably 2 to 100 μm, and more preferably 3 to 75 μm.

As the method for producing the molded article of the present invention, there may be mentioned, as being more preferred, a production method of polymerizing after applying a polymerizable composition containing the cycloolefin monomer, the polymerization catalyst, and the above cyclic peroxide onto the support medium.

Into the polymerizable composition to be used in the present invention, in addition to the above mentioned cycloolefin monomer and cyclic peroxide, and the polymerization catalyst to be hereinafter described as being essential component, polymerization regulating agent, chain transfer agent, polymerization reaction retardant and other compounding agents may be added in accordance with need. As the other compounding agents, filler, anti-aging agent, curing aid, flame retardant, coloring agent, light stabilizer, pigment, foaming agent and polymer modifying agent etc. may be mentioned similarly as described hereinbefore. Note that the references of cycloolefin polymer with respect to the amounts of the other compounding agents herein are substituted by those of cycloolefin monomer.

While the polymerization catalyst to be used in the present invention is not particularly limited insofar as it is capable of polymerizing cycloolefin monomer, metathesis polymerization catalyst is preferred to be usually used in view of improving the productivities of the molded article and prepreg. Metathesis polymerization catalyst is a catalyst capable of metathesis ring-opening polymerizing cycloolefin monomer, and, for example, a complex having a transition metal atom as a center atom, and a plurality of ions, atoms, polyatomic ions and/or compounds bonded thereto may be mentioned. As transition metal atoms, atoms in groups 5, 6 and 8 (long form of the periodic table, the same shall apply hereinafter) are used. Although the atom in each group is not particularly limited, tantalum may be mentioned as atom in group 5, for example, molybdenum and tungsten as atoms in group 6, for example, and ruthenium and osmium as atoms in group 8, for example. Among them, it is preferred to use the complex of ruthenium or osmium in group 8 as the metathesis polymerization catalyst, and ruthenium carbene complex is particularly preferable. Because the ruthenium carbene complex is superior in catalytic activity at the time of bulk polymerization, the molded article to be obtained is with less odor derived from unreacted monomer, and has a significant productivity. Moreover, the ruthenium carbene complex is relatively stable to oxygen and moisture in the air thereby scarcely deactivating, and therefore it is possible to be used for production under the atmosphere.

As the ruthenium carbene complex, the complex represented by the following formula (1) or formula (2) may be mentioned.

Chemical Formula 1:

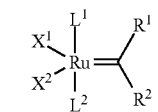
(1)

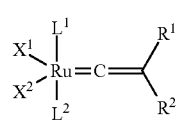
(2)

In formula (1) and formula (2), each of $R^1$ and $R^2$ independently represents a hydrogen atom, a halogen atom, or a hydrocarbon group with 1 to 20 carbon atoms which may contain a halogen atom, an oxygen atom, a nitrogen atom, a sulfur atom, a phosphorus atom or a silicon atom.

Each of $X^1$ and $X^2$ independently represents an arbitrary anionic ligand. The anionic ligand is a ligand having a negative electrical charge when being pulled away from the central metal atom, and, for example, a halogen atom, diketonate group, substituted cyclopentadienyl group, alkoxyl group, aryloxy group, and carboxyl group etc. may be mentioned. Among them, the halogen atom is preferable, and a chlorine atom is more preferable.

Each of $L^1$ and $L^2$ independently represents a heteroatom containing carbene compound or a neutral electron donative compound. The heteroatom means an atom in groups 15 and 16 of the periodic table, and N, O, P, S, As and Se atom etc. may be specifically mentioned. Among them, N, O, P and S atom etc. are preferable, and N is particularly preferable, from the viewpoint of being capable of obtaining a stable carbene compound.

As the heteroatom containing carbene compound, the compound represented by the following formula (3) or formula (4) may be mentioned.

Chemical Formula 2:

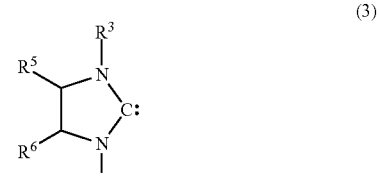
(3)

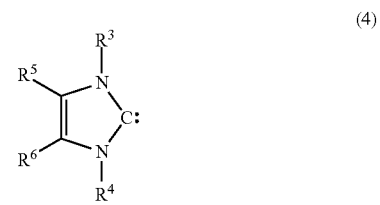
(4)

In the formulae, each of $R^3$ to $R^6$ independently represents a hydrogen atom, a halogen atom, or a hydrocarbon group with 1 to 20 carbon atoms which may contain a halogen atom, an oxygen atom, a nitrogen atom, a sulfur atom, a phosphorus atom or a silicon atom. In addition, $R^3$ to $R^6$ may be bonded with one another in any combination to form a ring.

As the neutral electron donative compound, any compound may be adopted so long as it is a ligand having a neutral electrical charge when being pulled away from the central metal atom. As the specific examples thereof, phosphines, ethers and pyridines etc. may be mentioned, and trialkylphosphine is more preferable.

In the above formulae (1) and (2), $R^1$ and $R^2$ may be bonded with each other to form a ring, and furthermore, $R^1$, $R^2$, $X^1$, $X^2$, $L^1$ and $L^2$ may be bonded with one another in any combination to form a multidentate chelated ligand.

In the present invention, it is preferred to use, as the polymerization catalyst, the ruthenium catalyst having a compound with hetero ring structure as a ligand, because the mechanical strength and the impact resistance of the dry film and the laminate to be obtained are highly balanced. As hetero atoms constituting the hetero ring structure, for example, an oxygen atom and a nitrogen atom etc. may be mentioned, and the nitrogen atom is preferable. In addition, as the hetero ring structure, imidazoline structure and imidazolidine structure are preferable. As specific examples of such compounds having hetero ring structures, 1,3-di(1-adamantyl)imidazolidin-2-ylidene, 1,3-dimesityloctahydrobenzimidazol-2-ylidene, 1,3-di(1-phenylethyl)-4-imidazolin-2-ylidene, 1,3,4-triphenyl-2,3,4,5-tetrahydro-1H-1,2,4-triazol-5-ylidene, 1,3-dicyclohexylhexahydropyrimidin-2-ylidene, N,N,N',N'-tetraisopropylformamidinylidene, 1,3-dimesitylimidazolidin-2-ylidene, 1,3-dicyclohexylimidazolidin-2-ylidene, 1,3-diisopropyl-4-imidazolidin-2-ylidene, and 1,3-dimesityl-2,3-dihydrobenzimidazol-2-ylidene etc. may be mentioned.

As the examples of preferable ruthenium catalysts, benzylidene(1,3-dimesitylimidazolidine-2-ylidene)(tricyclohexylphosphine)rutheniumdichloride, (1,3-dimesitylimidazolidine-2-ylidene)(3-methyl-2-butene-1-ylidene)(tricyclopentylphosphine)rutheniumdichloride, benzylidene(1,3-dimesityl-octahydrobenzimidazole-2-ylidene)(tricyclohexylphosphine)rutheniumdichloride, benzylidene[1,3-di(1-phenylethyl)-4-imidazoline-2-ylidene](tricyclohexylphosphine)rutheniumdichloride, benzylidene(1,3-dimesityl-2,3-dihydrobenzimidazole-2-ylidene)(tricyclohexylphosphine)rutheniumdichloride, benzylidene(tricyclohexylphosphine)(1,3,4-triphenyl-2,3,4,5-tetrahydro-1H-1,2,4-triazole-5-ylidene)rutheniumdichloride, (1,3-diisopropylhexahydropyrimidine-2-yliden)(ethoxymethylene)(tricyclohexylphosphine)rutheniumdichloride, benzylidene(1,3-dimesitylimidazolidine-2-ylidene)pyridineruthe niumdichloride, and other ruthenium complex compounds each having a compound with a hetero ring structure and a neutral electron donative compound as ligands may be mentioned.

Such polymerization catalysts are used either alone or in combinations of two or more types. The amount of the polymerization catalyst to be used is, in terms of the molar ratio of (metal atom in the catalyst:cycloolefin monomer), usually in a range of 1:2,000 to 1:2,000,000, preferably 1:5,000 to 1:1,000,000, and more preferably 1:10,000 to 1:500,000.

The polymerization catalyst may be used, if required, in a form of being dissolved or suspended in a small amount of inactive solvent. As such solvents, n-pentane, n-hexane, n-heptane, liquid paraffin, mineral spirits and other linear aliphatic hydrocarbons; cyclopentane, cyclohexane, methylcyclohexane, dimethylcyclohexane, trimethylcyclohexane, ethylcyclohexane, diethylcyclohexane, decahydronaphthalene, dicycloheptane, tricyclodecane, hexahydroindene, cyclooctane and other alicyclic hydrocarbons; benzene, toluene, xylene and other aromatic hydrocarbons; indene, tetrahydronaphthalene and other hydrocarbons having an alicyclic ring and an aromatic ring; nitromethane, nitrobenzene, acetonitrile and other nitrogen-containing solvents; diethyl ether, tetrahydrofuran and other oxygen-containing solvents; etc. may be mentioned. Among them, it is preferred to use aromatic hydrocarbon, aliphatic hydrocarbon, alicyclic hydrocarbon, or hydrocarbon having an alicyclic ring and an aromatic ring.

The polymerization regulating agent is blended for the purpose of regulating the polymerization activity and improving the polymerization reaction rate, and, for example, trialkoxyaluminum, triphenoxyaluminum, dialkoxyalkylaluminum, alkoxydialkylaluminum, trialkylaluminum, dialkoxyaluminumchloride, alkoxyalkylaluminumchloride, dialkylaluminumchloride, trialkoxyscandium, tetraalkoxytitanium, tetraalkoxytin, and tetraalkoxyzirconium etc. may be mentioned. Such polymerization regulating agents may be used alone or in combinations of two or more types. The amount of the polymerization regulating agent to be used is, in terms of the molar ratio of (metal atom in the polymerization catalyst:polymerization regulating agent), usually in a range of 1:0.05 to 1:100, preferably 1:0.2 to 1:20, and more preferably 1:0.5 to 1:10.

As the chain transfer agent, linear olefins which may have substituted groups are usually available. As the specific examples thereof, for example, 1-hexene, 2-hexene and other aliphatic olefins; styrene, divinylbenzene, stilbene and other olefins having aromatic groups; vinylcyclohexane and other olefins having alicyclic hydrocarbon groups; ethylvinylether and other vinylethers; methylvinylketone, 1,5-hexadiene-3-one, 2-methyl-1,5-hexadiene-3-one, vinyl methacrylate, allyl methacrylate, methacrylic acid 3-butene-1-yl, methacrylic acid 3-butene-2-yl, styryl methacrylate, allyl acrylate, acrylic acid 3-butene-1-yl, acrylic acid 3-butene-2-yl, acrylic acid1-methyl-3-butene-2-yl, styryl acrylate, ethyleneglycoldiacrylate, allyltrivinylsilane, allylmethyldivinylsilane, allyldimethylvinylsilane, glycidyl acrylate, allylglycidylether, allylamine, 2-(diethylamino) ethanolvinylether, 2-(diethylamino) ethylacrylate, and 4-vinylaniline etc. may be mentioned.

Such chain transfer agents may be used alone or in combinations of two or more types, and the additive amount thereof is usually in a range of 0.01 to 10 parts by weight, and preferably 0.1 to 5 parts by weight with respect to the cycloolefin monomer as 100 parts by weight.

It is preferred that the polymerizable composition to be used in the present invention contains a polymerization reaction retarder because of being capable of suppressing the viscosity increase thereof. As the polymerization reaction retarders, triphenylphosphine, tributylphosphine, trimethylphosphine, triethylphosphine, dicyclohexylphosphine, vinyldiphenylphosphine, allyldiphenylphosphine, triallylphosphine, styryldiphenylphosphine, and other phosphine compounds; aniline, pyridine and other Lewis bases; etc. may be used.

The polymerizable composition to be used in the present invention may be obtained by mixing the above components. As the mixing method, it is enough to be in line with the ordinary method. For example, the polymerizable composition may be prepared through adding a liquid (catalyst liquid) prepared by dissolving or dispersing the polymerization catalyst into an appropriate solvent into a liquid (monomer liquid) prepared by blending other compounding agents etc. used in accordance with need to cycloolefin monomer and cyclic peroxide and stirring them.

Application of the polymerizable composition onto the support medium may be performed by applying a certain amount of the polymerizable composition through, for example, spray coat method, dip coat method, roll coat method, curtain coat method, dye coat method, slit coat method, or other known methods in the art. If required, the application may be performed with overlapping a protecting film on the polymerizable composition. By heating the applied material to a certain temperature after applying the polymerizable composition onto the support medium, it is possible to bulk polymerize the polymerizable composition thereby obtaining a sheet shaped molded article.

The heating temperature for polymerizing the polymerizable composition is usually in a range of 50° C. to 250° C., preferably 100° C. to 200° C., and more preferably 120° C. to 170° C., and is usually the temperature of the one-minute half-life temperature of the above cyclic peroxide or less, preferably 10° C. or more lower than the one-minute half-life temperature thereof, and more preferably 20° C. or more lower than the one-minute half-life temperature thereof. While the polymerizing time may be suitably selected, it is usually in a range of 10 seconds to 20 minutes, and preferably 5 minutes or less. It is preferred to heat the polymerizable composition within such temperature ranges because it is possible to obtain the molded article with less unreacted monomer.

The molded article of the present invention is a sheet of being thermoplastic and crosslinkable.

While the thickness of the molded article of the present invention is suitably selected in accordance with the purpose of use, it is usually in a range of 0.001 to 10 mm, preferably 0.01 to 1 mm, and more preferably 0.05 to 0.5 mm. It is preferred that the thickness is within such ranges because the dilution performance at the time of laminating and the mechanical strength and toughness of the laminate to be obtained by curing are to be sufficient.

The molded article of the present invention formed on the support medium is capable of being provided, as a dry film, for the production of the laminate to be described hereinafter as it stands without removing the support medium.

(Prepreg)

The prepreg of the present invention is obtained by impregnating the curable resin composition of the present invention into a reinforcing fiber. Although the production method of the prepreg is not particularly limited and any known methods in the art may be adopted, for example, a method through dissolving or dispersing the curable resin composition into a solvent and impregnating it into the reinforcing fiber thereafter drying the solvent may be mentioned. As the solvent, similar one as for producing the above molded article may be used herein. The amount of the solvent to be used may be suitably selected in accordance with the amount of cycloolefin polymer and the type of the reinforcing fiber etc.

While the type of the reinforcing fiber to be used in the present invention is not particularly limited, for example, PET (polyethylene terephthalate) fiber, aramid fiber, supermacro-molecule polyethylene fiber, polyamide (nylon) fiber, liquid crystalline polyester fiber, and other organic fibers; glass fiber, carbon fiber, alumina fiber, tungsten fiber, molybdenum fiber, bdenum fiber, titanium fiber, steel fiber, boron fiber, silicon carbide fiber, silica fiber, and other inorganic fibers; etc. may be mentioned. Among them, organic fiber and glass fiber are preferable, aramid fiber, liquid crystalline polyester fiber and glass fiber are particularly preferable. As the glass fiber, fiber of E-glass, NE-glass, S-glass, D-glass and H-glass etc. may be used preferably.

As the glass fiber, it is preferred to use a glass cloth. Preferred glass cloth is obtained through bundling glass filaments with diameters of 1 to 10 μm to form strands, twisting the strands to form glass threads (referred to as "glass yarns"), and weaving up them. In addition, the thickness of the glass cloth is usually in a range of 5 to 200 μm, preferably 10 to 150 μm, more preferably 10 to 100 μm, and particularly preferably 20 to 80 μm. If the thickness is thinner than such ranges, the strength of the laminate to be obtained tends to become lower, and if the thickness is thicker than such ranges, it tends to difficult to control the thickness at the time of laminating.

Such reinforcing fibers may be used alone or in combinations of two or more types, and the amount thereof to be used is suitably selected in accordance with the purpose of use such that the containing amount of the reinforcing fiber in the prepreg to be obtained becomes to be usually in a range of 10 to 90 wt %, preferably 20 to 80 wt %, and more preferably 30 to 70 wt %. It is preferred that the containing amount of the reinforcing fiber is within such ranges because the improvement of mechanical strength and the reduction of dielectric loss are highly balanced in the laminate to be obtained.

More preferably as the production method of the prepreg of the present invention, there may be mentioned a production method through impregnating the polymerizable composition which contains cycloolefin monomer, polymerization catalyst and cyclic peroxide into the reinforcing fiber and thereafter polymerizing. The type, the amount and the like of each component to be used for the polymerizable composition is similar to those for the polymerizable composition to be used in producing the above mentioned molded article of the present invention.

Impregnating of the polymerizable composition into the reinforcing fiber may be performed through, for example, applying a certain amount of the polymerizable composition onto the reinforcing fiber by spray coat method, dip coat method, roll coat method, curtain coat method, dye coat method, slit coat method, or other known methods in the art, if required overlapping a protecting film thereon, and pressing them from the upper side by a roller or the like. By heating the impregnated material to a certain temperature after impregnating the polymerizable composition into the reinforcing fiber, it is possible to bulk polymerize the polymerizable composition thereby obtaining a sheet shaped or film shaped prepreg.

The impregnating may be also performed in a mold. In this case, the impregnating is performed through placing the reinforcing fiber in the mold and pouring the polymerizable compound into the mold. According to this method, it is possible to obtain a prepreg in arbitrary shape. As the shape thereof, sheet shape, film shape, columnar shape, cylindrical shape and polygonal columnar shape etc. may be mentioned. As the mold to be used herein, a molding tool known in the art, for example, the split mold structure i.e. a molding tool having a core mold and a cavity mold may be used, and the polymerizable composition is poured into the space area (cavity) therebetween, and bulk polymerizing. The core mold and the cavity mold are prepared so as to form the space area matching the form of the prepreg intended to be produced. In addition, the shape, material and size etc. of the molding tool are not particularly restricted. Alternatively, sheet shaped or film shaped prepreg may be obtained through preparing plate shaped molding tools such as glass plates, metal plates and the like and a spacer which has a certain thickness, pouring the polymerizable composition into a space formed by such two plate shaped molding tools between which the spacer intervenes, and curing the polymerizable composition in the mold.

The polymerizable composition is of lower viscosity than polymer varnish obtained by dissolving epoxy resin and the like into a solvent, which is used in the art, thereby being superior in impregnation property to a reinforcing fiber. Therefore, it is possible to homogeneously impregnating the resin to be obtained through polymerization into the reinforcing fiber. Therefore, the laminate to be obtained by using the prepreg of the present invention is capable of providing uniform electrical properties. That is, by using the polymerizable composition for producing a prepreg, it is enabled to homogeneously impregnating the composition into the reinforcing fibers and there remains scarcely solvent in the prepreg to be obtained, and therefore, by using the prepreg of the present invention, it is possible to obtain the laminate having uniformity in electrical properties, especially in dielectric loss without varying by location.

In either one of the above methods, temperature, time and other conditions for polymerizing the polymerizable composition are similar to those for producing the above mentioned molded article of the present invention.

While the thickness of the prepreg of the present invention is suitably selected in accordance with the purpose of use, it is usually in a range of 0.001 to 10 mm, preferably 0.01 to 1 mm, and more preferably 0.02 to 0.5 mm. It is preferred that the thickness is within such ranges because the dilution performance at the time of laminating, and the mechanical strength, and the toughness of the laminate to be obtained by curing are to be sufficient.

(Laminate)

The laminate of the first embodiment of the present invention is obtained by laminating the above mentioned molded article of the present invention with other material A other than the molded article and thereafter curing. In addition, the laminate of the second embodiment of the present invention is obtained by laminating two or more of the above mentioned prepregs of the present invention with one another or laminating the prepreg of the present invention with other material B other than the prepreg and thereafter curing.

The above other material A and other material B may be the same with or different from each other. While the other material A or B to be laminated is suitably selected in accordance with the purpose of use, for example, thermoplastic resin material, metal material, and circuit board etc. may be mentioned. Among them, as the other material A in the first embodiment, it is preferred to use a circuit board especially. Also, as the other material B in the second embodiment, it is preferred to use a metal material especially. In addition, from the viewpoint of improving the adhesive property between the resin layer and the metal material layer, it is preferred that the surface of the metal material is treated with silane coupling agent, thiol based coupling agent, titanate based coupling agent, or various types of adhesives etc. Among them, the metal material treated with silane coupling agent is more preferable.

Although the roughness degree (Rz) of layer surface of the metal material at the adhesive interface between the prepreg of the present invention and the metal material is not particularly limited, it is usually 10 μm or less, preferably 5 μm or less, more preferably 3 μm or less, and furthermore preferably 2 μm or less. On the other hand, while the lower limit of the roughness degree is not particularly limited, it is usually 10 nm or more, preferably 5 nm or more, and more preferably 1 nm or more. It is preferred that the roughness degree of layer surface of the metal material is within such ranges because noises, occurring of delays and transmission losses etc. in high frequency transmission are suppressed. The adjustment for the roughness degree of layer surface of the metal material is easily achieved through selecting a metal material to be laminated of which the roughness degree is within a required range and using the selected material. Metal material having such roughness degree is available as marketed products. Note that the roughness degree (Rz) is measurable by an AFM (atomic force microscope).

As the metal material, materials to be generally used for circuit boards may be used without any restriction, and metal foil is usually used and copper foil is preferably used. While the thickness of the metal material is suitably selected in accordance with the purpose of use, it is usually in a range of 1 to 50 μm, preferably 3 to 30 μm, more preferably 5 to 20 μm, and most preferably 5 to 15 μm.

In each of the above embodiments, the methods for laminating and curing are enough to be in line with ordinary methods, and method of performing heat presses by using roll laminator, pressing machine known in the art having press frame mold for flat plate molding, or press molding machines for sheet mold compound (SMC) or bulk mold compound (BMC) etc. may be mentioned, for example. The heating temperature is a temperature where the cross-linking by the above cyclic peroxide occurs, and is usually a temperature of the one-minute half-life temperature of the above cyclic peroxide or more, preferably 5° C. or more higher than the one-minute half-life temperature thereof, and more preferably 10° C. or more higher than the one-minute half-life temperature thereof. Such temperature is usually in a range of 100° C. to 300° C., and preferably 150° C. to 250° C. The heating time is in a range of 0.1 to 180 minutes, preferably 1 to 120 minutes, and more preferably 2 to 20 minutes. The pressing pressure is usually in a range of 0.1 to 20 MPa, preferably 0.1 to 10 MPa, and more preferably 1 to 5 MPa. Alternatively, the heat pressing may be performed in vacuum or reduced pressure atmosphere.

Thus obtained laminate of the present invention is with less transmission loss at high frequency bands thereby to be used widely and preferably as a high frequency board material.

EXAMPLES

Although the present invention will be more specifically described hereinafter with reference to examples and comparative examples, the present invention is not limited to these examples. It is to be noted that, in the examples and comparative examples, "parts" and "%" are based on weight basis unless otherwise noted.

Each property in the examples and comparative examples was measured and evaluated in accordance with the following methods.

(1) Laminatability of Molded Article: Embeddedness between wirings on the obtained laminate was observed by SEM and evaluated according to the following criteria.

A: The resin layer is embedded between wirings with no space.

B: Spaces are partly recognized between wirings.

C: Considerable spaces are recognized between wirings.

(2) Laminatability of Prepreg: Appearance of the obtained laminate was observed and evaluated in accordance with the following criteria.

A: No peel-off between the laminated layers and shape breaking were observed.

B: Peel-off between the laminated layers or shape breaking was observed only in part.

C: Peel-off between the laminated layers and shape breaking were observed.

(3) Dielectric Tangent: Dielectric tangent (tan δ) at the frequency of 1 GHz was measured by using impedance analyzer (available from Agilent Technologies, Inc., model number E4991A) by capacitance method and evaluated in accordance with the following criteria, where the dielectric tangent of Comparative Example 1 is to be 100 regarding Examples 1 to 5 and Comparative Example 1, and the dielectric tangent of Comparative Example 3 is to be 100 regarding Examples 6 to 9 and Comparative Example 3.

A: less than 80

B: 80 or more and less than 90

C: 90 or more and 100 or less

Production Example 1

Catalyst liquid was prepared by dissolving benzylidene(1,3-dimesityl-4-imidazolidine-2-ylidene)(tricyclohexylphosphine)rutheniumdichloride in 51 parts and triphenylphosphine in 79 parts into toluene in 952 parts. Aside from this, monomer liquid was prepared by mixing dicyclopentadiene (DCP) in 100 parts, allylmethacrylate as a chain transfer agent in 0.74 part, 3,3,5,7,7-pentamethyl-1,2,4-trioxepane (one-minute half-life temperature being 205° C.) as a curing agent in 2 parts, m-diisopropenylbenzene as a curing aid in 2 parts, and 3,5-di-t-butyl-4-hydroxyanisole as a phenol based anti-aging agent in 1 part. Then polymerizable composition was prepared by adding thereto the above catalyst liquid at a rate of 0.12 mL by 100 g of cycloolefin monomer and stirring them.

Production Example 2

Polymerizable composition was prepared in the same manner as Production Example 1 except for changing the curing aid in the monomer liquid to trimethylolpropanetrimethacrylate in 1 part.

Example 1

The polymerizable composition obtained in Production Example 1 was applied onto an electrolytic copper foil (thickness of 12 μm) and heated at 120° C. during 5 minutes to perform polymerization reaction, and a molded article of 0.1 mm thickness was obtained.

Eight sheets each obtained by cutting out a part of the prepared molded article and removing the copper foil were overlapped with one another and heat pressed at 205° C. during 20 minutes under 3 MPa thereby to be cured, and a sample for dielectric tangent measurement was prepared. The dielectric tangent of this sample was evaluated. The result thereof is shown in Table 1.

Then, the above molded article was laminated by using a laminator on a BT resin board formed with wirings of L/S=20/20 μm (conductor thickness of 18 μm) and heat pressed at 205° C. during 20 minutes under 3 MPa, and a laminate was obtained. The laminatability of the obtained laminate was evaluated. The result thereof is shown in Table 1.

TABLE 1

| | Structure of Curing Agent | Laminatability | Dielectric Loss |
|---|---|---|---|
| Example 1 | [structure] | A | A |
| Example 2 | [structure] | B | A |
| Example 3 | [structure] | C | B |
| Example 4 | [structure] | B | A |

TABLE 1-continued

| | Structure of Curing Agent | Laminatability | Dielectric Loss |
|---|---|---|---|
| Example 5 | [structure] | A | A |
| Comp. Example 1 | [structure] | C | C |
| Comp. Example 2 | —OOH | | Not polymerized |

Example 2

A molded article and a laminate were obtained in the same manner as Example 1 except for changing the curing agent to 3,6,9-triethyl-3,6,9-trimethyl-1,4,7-triperoxonane (one-minute half-life temperature being 190° C.) in 2 parts, and each property was evaluated. The result thereof is shown in Table 1.

Example 3

A molded article and a laminate were obtained in the same manner as Example 1 except for changing the curing agent to 3,6-diethyl-3,6-dimethyl-1,2,4,5-tetroxane (one-minute half-life temperature being 167° C.) in 2 parts, and each property was evaluated. The result thereof is shown in Table 1.

Example 4

A molded article and a laminate were obtained in the same manner as Example 1 except for using polyethylene naphthalate film (thickness of 40 μm) as the support medium, and each property was evaluated. The result thereof is shown in Table 1.

Example 5

A molded article and a laminate were obtained in the same manner as Example 1 except for changing the polymerizable composition to that obtained in Production Example 2, and each property was evaluated. The result thereof is shown in Table 1.

Comparative Example 1

A molded article and a laminate were obtained in the same manner as Example 1 except for changing the curing agent to di-t-butylperoxide (one-minute half-life temperature being 186° C.) in 1.2 parts, and each property was evaluated. The result thereof is shown in Table 1.

Comparative Example 2

Although performing in the same manner as Example 1 except for changing the curing agent to t-butylhydroperoxide (one-minute half-life temperature being 210° C.) in 2 parts, no polymerization occurred and no molded article was obtained.

Example 6

The polymerizable composition obtained in Production Example 1 was impregnated into a glass cloth (E-glass) and heated at 120° C. during 5 minutes to perform polymerization reaction, and a prepreg of 0.15 mm thickness was obtained. Note that the glass cloth containing amount of the prepreg was 40%.

Then, six sheets of the obtained prepregs were overlapped with one another and heat pressed at 205° C. during 20 minutes under 3 MPa, and a laminate was obtained. The laminatability and the dielectric tangent of the obtained laminate were evaluated. The result thereof is shown in Table 2.

TABLE 2

| | Structure of Curing Agent | Laminatability | Dielectric Loss |
|---|---|---|---|
| Example 6 | [structure] | A | A |
| Example 7 | [structure] | B | A |
| Example 8 | [structure] | C | B |
| Example 9 | [structure] | A | A |
| Comp. Example 3 | —OO— | C | C |
| Comp. Example 4 | —OOH | Not polymerized | |

Example 7

A prepreg and a laminate were obtained in the same manner as Example 6 except for changing the curing agent to 3,6,9-triethyl-3,6,9-trimethyl-1,4,7-triperoxonane (one-minute half-life temperature being 190° C.) in 2 parts, and each property was evaluated. The result thereof is shown in Table 2.

Example 8

A prepreg and a laminate were obtained in the same manner as Example 6 except for changing the curing agent to 3,6-diethyl-3,6-dimethyl-1,2,4,5-tetroxane (one-minute half-life temperature being 167° C.) in 2 parts, and each property was evaluated. The result thereof is shown in Table 2.

Example 9

A prepreg and a laminate were obtained in the same manner as Example 6 except for changing the polymerizable composition to that obtained in Production Example 2, and each property was evaluated. The result thereof is shown in Table 2.

Comparative Example 3

A prepreg and a laminate were obtained in the same manner as Example 6 except for changing the curing agent to di-t-butylperoxide (one-minute half-life temperature being 186° C.) in 1.2 parts, and each property was evaluated. The result thereof is shown in Table 2.

Comparative Example 4

Although performing in the same manner as Example 6 except for changing the curing agent to t-butylhydroperoxide (one-minute half-life temperature being 210° C.) in 2 parts, no polymerization occurred and no prepreg was obtained.

From the above examples and comparative examples, it is understood that, according to the molded article and the prepreg of the present invention, the laminate superior in laminatability and low in dielectric loss at high frequency bands thereby to be of excellent electrical properties can be obtained.

The invention claimed is:

1. A curable resin composition comprising a cycloolefin polymer and a cyclic peroxide which has a cyclic structure and a peroxy structure in said cyclic structure.

2. The curable resin composition as set forth in claim 1, wherein one-minute half-life temperature of said cyclic peroxide is within a range of 150° C. to 250° C.

3. The curable resin composition as set forth in claim 1, further comprising a curing aid.

4. The curable resin composition as set forth in claim 2, further comprising a curing aid.

5. A molded article obtained by forming the curable resin composition as set forth in claim 1 into a sheet shape.

6. A molded article obtained by forming the curable resin composition as set forth in claim 2 into a sheet shape.

7. A molded article obtained by forming the curable resin composition as set forth in claim 3 into a sheet shape.

8. A molded article obtained by forming the curable resin composition as set forth in claim 4 into a sheet shape.

9. A production method of the molded article as set forth in claim 5, comprising applying onto a support medium, a polymerizable composition comprising a cycloolefin monomer, a polymerization catalyst, and a cyclic peroxide which has a cyclic structure and a peroxy structure in said cyclic structure and thereafter polymerizing the same.

10. A laminate obtained by laminating the molded article as set forth in claim 5 with other material A and thereafter curing the same.

11. A prepreg obtained by impregnating the curable resin composition as set forth in claim 1 into a reinforcing fiber.

12. A prepreg obtained by impregnating the curable resin composition as set forth in claim 2 into a reinforcing fiber.

13. A prepreg obtained by impregnating the curable resin composition as set forth in claim 3 into a reinforcing fiber.

14. A prepreg obtained by impregnating the curable resin composition as set forth in claim 4 into a reinforcing fiber.

15. A production method of the prepreg as set forth in claim 11, comprising impregnating, into a reinforcing fiber, a polymerizable composition comprising a cycloolefin monomer, a polymerization catalyst, and a cyclic peroxide which has a cyclic structure and a peroxy structure in the cyclic structure and thereafter polymerizing the same.

16. A laminate obtained by laminating two or more of the prepregs as set forth in claim 11 with one another and thereafter curing the same.

17. A laminate obtained by laminating the prepeg as set forth in claim 11, with other material B and thereafter curing the same.

* * * * *